United States Patent
Suga et al.

(10) Patent No.: US 9,121,090 B2
(45) Date of Patent: Sep. 1, 2015

(54) RESIN MOLDED ARTICLES

(75) Inventors: Takeharu Suga, Hiroshima (JP);
Masaharu Okamura, Hiroshima (JP);
Hiroshi Ahagon, Hiroshima (JP);
Hiroharu Kojima, Hiroshima (JP);
Norio Nawachi, Hiroshima (JP); Akira Yamamoto, Hiroshima (JP)

(73) Assignees: DAIKYO NISHIKAWA CORPORATION, Hiroshima (JP);
HIROSHIMA PREFECTURE, Hiroshima (JP)

( * ) Notice: Subject to any disclaimer, the term of this patent is extended or adjusted under 35 U.S.C. 154(b) by 176 days.

(21) Appl. No.: 12/735,842

(22) PCT Filed: Feb. 19, 2009

(86) PCT No.: PCT/JP2009/000717
§ 371 (c)(1),
(2), (4) Date: Aug. 20, 2010

(87) PCT Pub. No.: WO2009/104407
PCT Pub. Date: Aug. 27, 2009

(65) Prior Publication Data
US 2010/0327629 A1    Dec. 30, 2010

(30) Foreign Application Priority Data
Feb. 20, 2008    (JP) ................. 2008-038406

(51) Int. Cl.
C23C 16/02 (2006.01)
B32B 27/06 (2006.01)
C23C 16/30 (2006.01)
C23C 16/505 (2006.01)

(52) U.S. Cl.
CPC ............. *C23C 16/0272* (2013.01); *B32B 27/06* (2013.01); *C23C 16/30* (2013.01); *C23C 16/505* (2013.01); *Y10T 428/265* (2015.01)

(58) Field of Classification Search
None
See application file for complete search history.

(56) References Cited

U.S. PATENT DOCUMENTS

| 4,796,155 A | 1/1989 | Saito et al. |
| 4,842,941 A * | 6/1989 | Devins et al. ................. 428/412 |
| 5,093,152 A * | 3/1992 | Bonet et al. ................... 427/575 |
| 5,298,587 A | 3/1994 | Hu et al. |

(Continued)

FOREIGN PATENT DOCUMENTS

| EP | 0 285 870 A2 | 10/1988 |
| EP | 1837319 A2 * | 9/2007 |

(Continued)

OTHER PUBLICATIONS

CAS Registry No. 25656-90-0, SciFinder American Chemical Society (ACS) (2014).*

(Continued)

*Primary Examiner* — Kenneth Stachel
(74) *Attorney, Agent, or Firm* — Roberts Mlotkowski Safran & Cole P.C.

(57) ABSTRACT

In a resin molded article (M), a wear-resistant surface layer (2) is provided on a surface of a base (1) made of a thermoplastic resin with an undercoat layer (3) being interposed therebetween, and the surface layer (2) has a composition containing silicon, oxygen, carbon, and hydrogen, a thickness of 0.02 μm or greater and 0.48 μm or less, and a density of greater than 1.5 g/cm³ or a hardness of 1.5 GPa or greater.

2 Claims, 2 Drawing Sheets

(56) References Cited

U.S. PATENT DOCUMENTS

| | | | |
|---|---|---|---|
| 5,320,875 A | | 6/1994 | Hu et al. |
| 5,508,368 A | | 4/1996 | Knapp et al. |
| 5,618,619 A | | 4/1997 | Petrmichl et al. |
| 5,679,413 A | | 10/1997 | Petrmichl et al. |
| 5,759,643 A | * | 6/1998 | Miyashita et al. ........... 428/1.31 |
| 5,846,649 A | | 12/1998 | Knapp et al. |
| 5,888,593 A | | 3/1999 | Petrmichl et al. |
| 6,077,569 A | | 6/2000 | Knapp et al. |
| 6,083,313 A | * | 7/2000 | Venkatraman et al. .. 106/287.14 |
| RE37,294 E | | 7/2001 | Knapp et al. |
| 6,376,064 B1 | * | 4/2002 | Gasworth et al. ............. 428/331 |
| 2005/0012975 A1 | * | 1/2005 | George et al. ................. 359/223 |
| 2006/0066998 A1 | * | 3/2006 | Ishiguro ........................ 360/128 |
| 2007/0190291 A1 | * | 8/2007 | Kitahara et al. ............. 428/157 |
| 2007/0264508 A1 | | 11/2007 | Gabelnick et al. |
| 2008/0171162 A1 | * | 7/2008 | Weikart et al. ............... 428/35.7 |

FOREIGN PATENT DOCUMENTS

| | | |
|---|---|---|
| JP | 64-004343 | 1/1989 |
| JP | 5-202211 A | 8/1993 |
| JP | H10-500609 | 1/1998 |
| JP | 2003-266587 A | 9/2003 |
| JP | 2004-175094 | 6/2004 |
| JP | 2004-237513 | 8/2004 |
| JP | 2008-518109 | 5/2008 |
| JP | 2003-11661 A | 1/2015 |
| WO | 95/24275 A2 | 9/1995 |
| WO | 2006/049794 A2 | 5/2006 |

OTHER PUBLICATIONS

International Search Report for PCT/JP2009/000717 mailed May 19, 2009.

* cited by examiner

RESIN MOLDED ARTICLES

TECHNICAL FIELD

The present invention relates to resin molded articles having excellent wear resistance.

BACKGROUND ART

In recent years, there has been a demand for window glass that is made of organic glass (plastic) (glazing panels made of resin) instead of inorganic glass in order to reduce the weight of an automobile. In this case, the panel needs to have a hardness sufficient to hinder or prevent the panel surface from having scratches due to wipers, flaws due to small stones, or the like.

PATENT DOCUMENTS 1-4 describe that the wear resistance of glazing panels for automobiles is improved by providing (growing) a hard surface layer on a surface of a resin base made of polycarbonate or the like by plasma-enhanced chemical vapor deposition (CVD).

CITATION LIST

Patent Documents

PATENT DOCUMENT 1: Japanese Patent Laid-Open Publication No. 2003-11661 (paragraphs 0019-0022 and FIG. 3)
PATENT DOCUMENT 2: Japanese Patent No. 3488458 (pages 7 and 8)
PATENT DOCUMENT 3: Japanese Patent No. 3203437 (paragraphs 0001, 0013, 0014, and 0025)
PATENT DOCUMENT 4: Japanese Patent Laid-Open Publication No. 2003-266587 (paragraphs 0002, 0030, and 0042, and FIG. 4)

SUMMARY OF THE INVENTION

In a resin molded article according to the present invention, a wear-resistant surface layer is provided on a surface of a base made of a thermoplastic resin with an undercoat layer being interposed therebetween, and the surface layer has a composition containing silicon (Si), oxygen (O), carbon (C), and hydrogen (H), a thickness of 0.02 µm or greater and 0.48 µm or less, and a density of greater than 1.5 g/cm$^3$ or a hardness of 1.5 GPa or greater.

DESCRIPTION OF EMBODIMENTS

Figure 1:
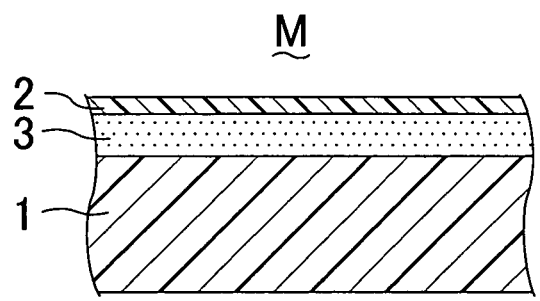
FIG. 1 is a cross-sectional view of a resin molded article.

An embodiment will be described hereinafter in detail.
FIG. 1 shows a resin molded article M according to this embodiment. Examples of applications of the resin molded article M include glazing panels for automotive windows which are alternatives to side window glass, rear window glass, sunroof glass, and the like of automobiles.

In the resin molded article M of this embodiment, a wear-resistant surface layer 2 is provided on a surface of a base 1 made of a thermoplastic resin with an undercoat layer 3 being interposed therebetween. The surface layer 2 has a composition containing silicon (Si), oxygen (O), carbon (C), and hydrogen (H), and has a thickness of 0.02 µm or greater and 0.48 µm or less, and a density of greater than 1.5 g/cm$^3$ or a hardness of 1.5 GPa or greater.

According to the resin molded article M of this embodiment, the strength, elasticity, and hardness of the surface layer 2 fall within appropriate ranges, the base 1 is hindered or prevented from being deformed, and excellent wear resistance can be obtained. When the resin molded article M is used as an automotive window glazing panel, it is possible to hinder or prevent the surface of the automotive window glazing panel from having scratches due to wipers, flaws due to small stones, or the like, resulting in an improvement in the durability.

The base 1 is made of a thermoplastic resin. When applied to glazing panels which are alternatives to rear window glass, sunroof glass, and the like of automobiles, the base 1 preferably has a thickness of 3 mm or greater and 5 mm or less in view of the strength, the weight, and the like.

Examples of the thermoplastic resin of which the base 1 is made include polyethylene, polypropylene, polystyrene, polyvinyl acetate, polyvinyl alcohol, polyvinyl acetal, polymethacrylate, polyacrylic acid, polyether, polyester, polycarbonate, cellulose, polyacrylonitrile, polyamide, polyimide, polyvinyl chloride, fluorine-containing resins, and the like.

The surface layer 2, which is provided on the surface of the base 1 by, for example, plasma-enhanced CVD, has a composition containing silicon (Si), oxygen (O), carbon (C), and hydrogen (H). In the surface layer 2, the composition ratio of oxygen (O) to silicon (Si) is preferably greater than or equal to 1.5 and less than 2.0, the composition ratio of carbon (C) to silicon (Si) is preferably less than or equal to 0.33, and the composition ratio of hydrogen (H) to silicon (Si) is preferably greater than or equal to 0.4 and less than or equal to 6. In other words, when the chemical formula of the constituent material for the surface layer 2 is represented by SiOxCyHz, x is preferably greater than or equal to 1.5 and less than 2.0, y is preferably less than or equal to 0.33, and z is greater than or equal to 0.4 and less than or equal to 6. Note that the hydrogen (H) content can be measured by elastic recoil detection analysis (ERDA).

The surface layer 2 has a thickness of 0.02 µm or greater and 0.48 µm or less. When the thickness of the surface layer 2 is less than 0.02 µm, the strength of the surface layer 2 is not sufficient and may be easily worn, resulting in lower wear resistance. On the other hand, when the thickness of the surface layer 2 is greater than 0.48 µm, the elasticity of the surface layer 2 is low and may be easily scratched, resulting in lower wear resistance. In view of these considerations, the thickness of the surface layer 2 is preferably greater than or equal to 0.02 µm and less than or equal to 0.48 µm, more preferably greater than or equal to 0.04 µm and less than or equal to 0.40 µm.

The surface layer 2 has a density of 1.5 g/cm$^3$ or greater or a hardness of 1.5 GPa or greater. If any one of these conditions is satisfied (i.e., the density of the surface layer 2 is greater than 1.5 g/cm$^3$ or the hardness of the surface layer 2 is greater than 1.5 GPa), the surface layer 2 has an appropriate degree of softness, resulting in excellent wear resistance. In view of this consideration, the density of the surface layer 2 is more preferably greater than or equal to 1.75 g/cm$^3$. The density of the surface layer 2 is preferably less than or equal to 2.20 g/cm$^3$. The hardness of the surface layer 2 is more preferably greater than or equal to 1.8 GPa. The hardness of the surface layer 2 is preferably less than 8.8 GPa. Note that fused quartz ($SiO_2$) has a density of 2.20 $g/cm^3$ and a hardness of 8.0-8.8 GPa. If the surface layer 2 has a density or a hardness close to these values, the surface layer 2 can be expected to have wear resistance comparable to that of fused quartz. Note that the hardness of the surface layer 2 is a nanoindentation hardness.

The surface layer 2 may contain nitrogen, chlorine, or the like in addition to silicon (Si), oxygen (O), carbon (C), and hydrogen (H).

The surface layer 2 may be formed by plasma-enhanced CVD, hot-wire CVD, Cat CVD, sputtering, or the like, preferably plasma-enhanced CVD.

Incidentally, in the technique of PATENT DOCUMENT 2, the surface layer has a thickness of as great as 2 μm or greater and 8 μm or less. Also in the technique of PATENT DOCUMENT 3, the surface layer has a thickness of as large as 1 μm or greater and 5 μm or less. In the technique of PATENT DOCUMENT 4, the surface layer has a thickness of 1 μm or greater and 50 μm or less, i.e., the maximum value is considerably great. In all of the cases, a target level of wear resistance cannot be obtained. Note that PATENT DOCUMENT 1 does not describe the thickness of the surface layer.

On the other hand, plasma-enhanced CVD can grow a film at a lower temperature than those of other CVD techniques, and in addition, has a higher growth rate. Therefore, if the surface layer 2 is formed by plasma-enhanced CVD, the thickness of the surface layer 2 can be largely reduced compared to the techniques described in PATENT DOCUMENTS 2-4. Therefore, the base 1 is not exposed to a high temperature environment for a long time. As a result, the deformation of the base 1 can be reliably reduced or prevented, and the surface layer 2 can be easily formed on the surface of the base 1.

In this case, examples of an organic silicon compound introduced into the chamber of a plasma-enhanced CVD apparatus include siloxanes, such as tetramethyldisiloxane, hexamethyldisiloxane, and the like; silanes, such as methoxytrimethylsilane, ethoxytrimethylsilane, dimethoxydimethylsilane, dimethoxydiethylsilane, dimethoxydiphenylsilane, trimethoxymethylsilane, tetramethoxysilane, trimethoxysilane, triethoxyethylsilane, trimethoxypropylsilane, triethoxymethylsilane, triethoxyethylsilane, triethoxyphenylsilane, diethoxydimethylsilane, hexamethylcyclotrisiloxane, triethoxyphenylsilane, tetraethoxysilane, and the like; silazanes, such as hexamethyldisilazane, tetramethyldisilazane, and the like; and the like. These organic silicon compounds may be used singly or in combination. Oxygen gas may be introduced along with silane or tetramethylsilane into the chamber of the plasma-enhanced CVD apparatus.

The temperature of the base during the growth of the film is preferably 0-120° C., more preferably 20-80° C. The pressure in the chamber is preferably 0.1-100 Pa, more preferably 0.5-20 Pa. The growth time is preferably 20 sec to 1 hr. The high frequency power may be a continuous high frequency or a pulsed high frequency.

The undercoat layer 3 is an adhesive layer which is provided in order to improve adhesion between the base 1 and the surface layer 2. The undercoat layer 3 may have a monolayer structure or a multilayer structure. In the latter case, for example, a liquid acrylic resin material is applied onto the surface of the base 1 to form a first undercoat layer, and thereafter, a liquid silicone resin material is applied on a surface of the first undercoat layer to form a second undercoat layer. The undercoat layer 3 preferably has a thickness of 7.5 μm or greater and 14.5 μm or less, more preferably 12 μm or greater and 14 μm or less, irrespective of whether the undercoat layer 3 has a monolayer structure or a multilayer structure. The undercoat layer 3 preferably has a hardness lower than that of the surface layer 2. Specifically, the hardness of the undercoat layer 3 is preferably greater than or equal to 100 MPa and less than or equal to 1.5 GPa, more preferably greater than or equal to 200 MPa and less than or equal to 800 MPa.

Examples

Resin Molded Article Test Piece

A resin molded article test piece was prepared as follows.

Initially, a plate-like base made of a polycarbonate (thickness: 4 mm, 250 mm×250 mm) was prepared.

A liquid acrylic resin material (manufactured by TEIJIN CHEMICALS LTD., trade name: thermosetting acrylic primer paint DMS200) was applied to a surface of the base to form a first undercoat layer. A silicon resin material (manufactured by TEIJIN CHEMICALS LTD., trade name: thermosetting silicon topcoat paint DMN200) was applied to a surface of the first undercoat layer to form a second undercoat layer. As a result, an undercoat layer having a thickness of 10 μm was formed on the base.

Next, the base on which the undercoat layer was formed was placed in the chamber of a plasma processing apparatus. The pressure in the chamber was reduced and set to $10^{-2}$ Pa.

Thereafter, while introducing into the chamber of the plasma-enhanced CVD apparatus a silane-based organic silicon compound containing a bond between a silicon atom and an oxygen atom at room temperature, the pressure in the chamber was set to 1-5 Pa, and a predetermined high frequency power was applied to the upper electrode and the lower electrode to generate plasma, thereby forming on the undercoat layer a surface layer having a composition containing silicon (Si), oxygen (O), carbon (C), and hydrogen (H).

As a group A, nine resin molded article test pieces were produced at a constant high frequency power output value of 800 W for a discharge time of 0 min (control), 2 min, 5 min, 12 min, 30 min, 35 min, 40 min, 48 min, and 90 min. Note that the test pieces are indicated by A1-A9 in order of increasing discharge time.

As a group B, fourteen resin molded article test pieces were produced at a high frequency power output value which was changed within the range of 150-900 W, where the surface layer 2 had a constant thickness of 0.1 μm. Note that the test pieces are indicated by B1-B14 in order of increasing high frequency power output value.

As a group C, a resin molded article test piece was produced at a high frequency power output value of 60 W using a plasma-enhanced CVD apparatus having a small chamber. Note that the test piece is indicated by C1.

(Method for Testing and Evaluation)
<Composition>
For each of B1-B9, B11, B13, and B14, and C1, the silicon (Si), oxygen (O), and carbon (C) contents of the surface layer were measured with an X-ray photoelectron spectrometer (manufactured by VG Scientific, model no.: ESCALab200iXL) using an Al—Kα monochromatic X-ray source. The oxygen (O) and carbon (C) contents were divided by the silicon content to obtain the composition ratios of oxygen (O) and carbon (C) to silicon (Si), respectively.

<Thickness>

For each of A1-A9 and C1, the thickness of the surface layer was calculated using the refractive index for visible light based on a measurement using a thin-film thickness measurement system (manufactured by Filmetrics Inc., model no.: F20).

<Density>

For each of B1, B3-B9, B11, B13, and B14, and C1, the density of the surface layer was calculated using the reflectance of an X-ray based on a measurement using an X-ray diffractometer (manufactured by Mac Science, model no.: M03XHF22).

<Hardness>

For each of B1-B14 and C1, the hardness of the surface layer was obtained by nanoindentation using a measurement apparatus which was Nanoscope III manufactured by Digital Instruments to which Triboscope manufactured by Hysitron Incorporated was attached.

Specifically, a triangular pyramid-shaped diamond indenter having a tip angle of 90° was caused to contact the surface layer of the resin molded article test piece at right angles. The load applied to the surface layer was increased to the maximum load in 5 sec and then decreased back to 0 in 5 sec to create a load-displacement curve, based on which the hardness was then calculated using Oliver's method. Note that, for B1-B14, the thickness of the surface layer was greater than or equal to 100 nm, and the contact depth as measured when the maximum load was applied was within the range of 25-30 nm. Note that, before the measurement, the measurement apparatus was calibrated using fused quartz as a standard sample to confirm that the hardness fell within 8.0-8.8 GPa. As an example, when the contact dept was 26 nm, the hardness was 8.2 GPa.

<Haze Value (ΔH) after Wear Test>

For each of A1-A9, B1-B14, and C1, after Taber wear testing was performed based on JIS R3211, the haze value (ΔH) of the surface layer was measured with a haze meter (manufactured by Suga Test Instruments Co. Ltd., model no.: HGM 3GP) using the measurement light which was obtained form Standard Illuminant A, under the following conditions.

Tester: model no. 5130 ABRASER (Taber Industries)
Abrading wheel: hardness (IRHD) 72±5
Testing load: 500 g
Rotational speed: 60 rpm
Number of rotations: 1000

The tolerable upper limit of the haze value was set to 4.0%, assuming that the resin molded article was applied to automotive window glass. Resin molded articles having a haze value of 4.0% or less were determined to be "good (OK)" which means that the resin molded article is applicable to glazing panels which are alternatives to side window glass, rear window glass, sunroof glass, and the like of automobiles. Resin molded articles having a haze value of greater than 4.0% were determined to be "not good (NG)" which means that the resin molded article is not applicable.

(Results of Testing and Revaluation)

<Group A>

TABLE 1

|  | A1 | A2 | A3 | A4 | A5 | A6 | A7 | A8 | A9 |
|---|---|---|---|---|---|---|---|---|---|
| Film Growth Time (min) | 0 | 2 | 5 | 12 | 30 | 35 | 40 | 48 | 90 |
| Thickness (μm) | 0 | 0.02 | 0.05 | 0.11 | 0.26 | 0.34 | 0.40 | 0.42 | 0.72 |
| Haze Value (%) | 6.0 | 2.3 | 1.2 | 1.6 | 0.7 | 1.0 | 2.0 | 2.2 | 14.2 |
| Evaluation | NG | OK | OK | OK | OK | OK | OK | OK | NG |

Figure 2:
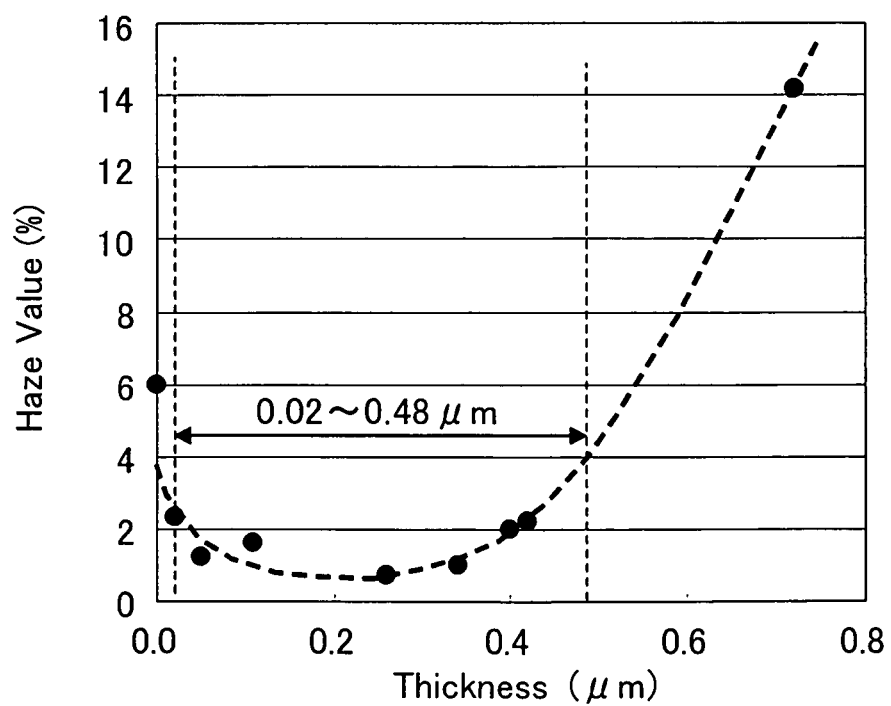
FIG. 2 is a graph showing a relationship between the thickness and haze value of a surface layer.

Table 1 shows the results of testing on A1-A9. FIG. 2 shows a relationship between the thickness and haze value of the surface layer.

The thickness of the surface layer was 0 μm for A1, 0.02 μm for A2, 0.05 μm for A3, 0.11 μm for A4, 0.26 μm for A5, 0.34 μm for A6, 0.40 μm for A7, 0.42 μm for A8, and 0.72 μm for A9.

The haze value was 6.0% for A1, 2.3% for A2, 1.2% for A3, 1.6% for A4, 0.7% for A5, 1.0% for A6, 2.0% for A7, 2.2% for A8, and 14.2% for A9.

The evaluation of the applicability to glazing panels was OK for A2-A8 and NG for A1 and A9.

<Group B>

TABLE 2

|  | B1 | B2 | B3 | B4 | B5 | B6 | B7 | B8 | B9 | B10 | B11 | B12 | B13 | B14 |
|---|---|---|---|---|---|---|---|---|---|---|---|---|---|---|
| O/Si | 1.88 | 1.94 | 1.91 | 1.88 | 1.82 | 1.85 | 1.77 | 2.03 | 1.54 | — | 1.75 | — | 1.70 | 1.82 |
| C/Si | 0.06 | 0.11 | 0.13 | 0.08 | 0.14 | 0.09 | 0.04 | 0.10 | 0.12 | — | 0.017 | — | 0.003 | ND |
| Density (g/cm³) | 1.65 | — | 1.65 | 1.70 | 1.75 | 1.75 | 1.75 | 1.75 | 1.90 | — | 2.15 | — | 2.20 | 2.20 |
| Hardness (GPa) | 1.4 | 1.4 | 1.6 | 1.7 | 2.5 | 2.6 | 1.2 | 1.1 | 3.4 | 3.8 | 4.0 | 4.9 | 5.0 | 5.5 |
| Haze Value (%) | 3.6 | 4.8 | 2.0 | 1.7 | 1.5 | 1.2 | 3.4 | 3.5 | 1.6 | 1.3 | 1.5 | 1.7 | 1.4 | 1.2 |
| Evaluation | OK | NG | OK | OK | OK | OK | OK | OK | OK | OK | OK | OK | OK | OK |

Figure 3:
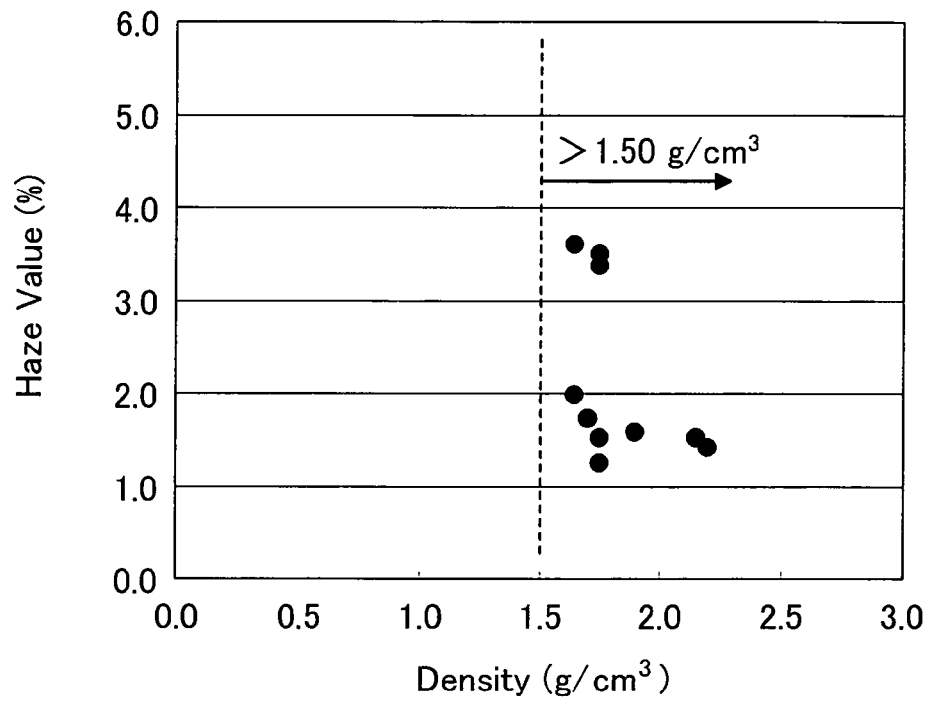
FIG. 3 is a graph showing a relationship between the density and haze value of the surface layer.
Figure 4:
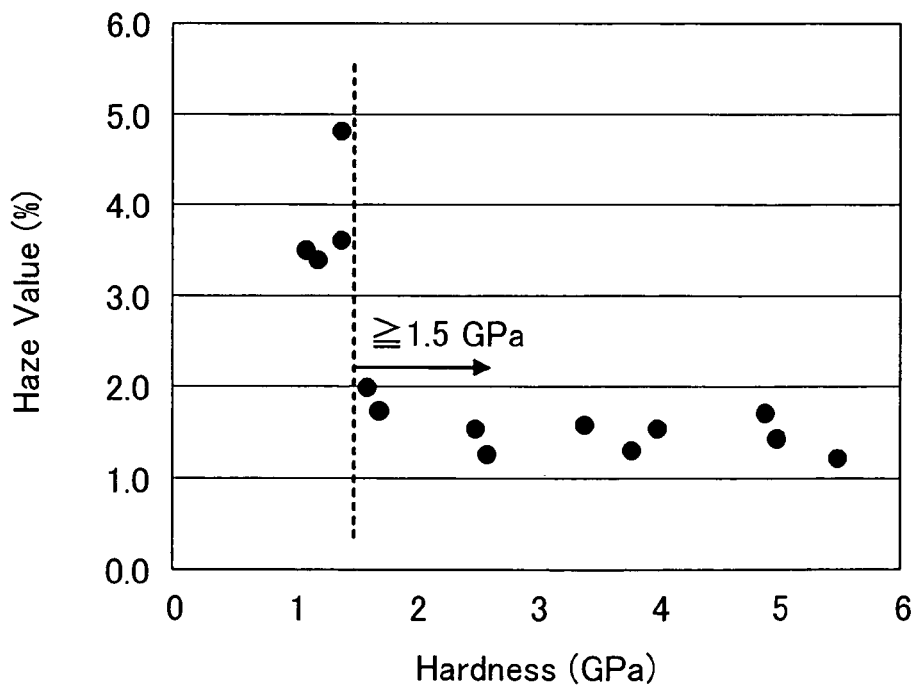
FIG. 4 is a graph showing a relationship between the hardness and haze value of the surface layer.

Table 2 shows the results of testing on B1-B14. FIG. 3 shows a relationship between the density and haze value of the surface layer and FIG. 4 shows a relationship between the hardness and haze value of the surface layer.

The composition ratio of oxygen (O) to silicon (Si) was 1.88 for B1, 1.94 for B2, 1.91 for B3, 1.88 for B4, 1.82 for B5, 1.85 for B6, 1.77 for B7, 2.03 for B8, 1.54 for B9, 1.75 for B11, 1.70 for B13, and 1.82 for B14.

The composition ratio of carbon (C) to silicon (Si) was 0.06 for B1, 0.11 for B2, 0.13 for B3, 0.08 for B4, 0.14 for B5, 0.09 for B6, 0.04 for B7, 0.10 for B8, 0.12 for B9, 0.017 for B11, and 0.003 for B13. Note that no data was obtained for B14.

The density of the surface layer was 1.65 g/cm³ for B1, 1.65 g/cm³ for B3, 1.70 g/cm³ for B4, 1.75 g/cm³ for B5, 1.75 g/cm³ for B6, 1.75 g/cm³ for B7, 1.75 g/cm³ for B8, 1.90 g/cm³ for B9, 2.15 g/cm³ for B11, 2.20 g/cm³ for B13, and 2.20 g/cm³ for B14.

The hardness of the surface layer was 1.4 GPa for B1, 1.4 GPa for B2, 1.6 GPa for B3, 1.7 GPa for B4, 2.5 GPa for B5, 2.6 GPa for B6, 1.2 GPa for B7, 1.1 GPa for B8, 3.4 GPa for B9, 3.8 GPa for B10, 4.0 GPa for B11, 4.9 GPa for B12, 5.0 GPa for B13, and 5.5 GPa for B14.

The haze value was 3.6% for B1, 4.8% for B2, 2.0% for B3, 1.7% for B4, 1.5% for B5, 1.2% for B6, 3.4% for B7, 3.5% for B8, 1.6% for B9, 1.3% for B10, 1.5% for B11, 1.7% for B12, 1.4% for B13, and 1.2% for B14.

The evaluation of the applicability to glazing panels was OK for B1 and B3-B14, and NG for B2.

<Group C>

TABLE 3

| | C1 |
|---|---|
| Power (W) | 60 |
| O/Si | 2.02 |
| C/Si | 0.33 |
| Thickness (μm) | 0.28 |
| Density (g/cm³) | 2.10 |
| Hardness (GPa) | 3.1 |
| Haze Value (%) | 1.7 |
| Evaluation | OK |

Table 3 shows the results of testing on C1.

The composition ratio of oxygen (O) to silicon (Si) of C1 was 2.02. The composition ratio of carbon (C) to silicon (Si) of C1 was 0.33. The thickness of the surface layer of C1 was 0.28 μm. The density of the surface layer of C1 was 2.10 g/cm³. The hardness of the surface layer of C1 was 3.1 GPa. The haze value of C1 was 1.7%. The evaluation of the applicability to glazing panels of C1 was OK.

Note that some of the samples of the groups A, B, and C for which the evaluation of the applicability to glazing panels was OK were selected, and the hydrogen (H) contents thereof were measured by ERDA. As a result, the composition ratios of carbon (C) to silicon (Si) were greater than or equal to 0.4 and less than or equal to 6.

It can be seen from the aforementioned results that if the thickness of the surface layer was 0.02-0.48 μm, more preferably 0.04-0.40 μm, and the density is greater than 1.5 g/cm³, preferably greater than or equal to 1.75 g/cm³ or the hardness is greater than or equal to 1.5 GPa, preferably greater than or equal to 1.8 GPa, a resin molded article having excellent wear resistance which is applicable to glazing panels for automotive windows can be obtained.

It can also be seen that, in all of the resin molded articles having excellent wear resistance, the composition ratio of oxygen (O) to silicon (Si) was greater than or equal to 1.5 and less than 2.0, and the composition ratio of carbon (C) to silicon (Si) was less than or equal to 0.33.

INDUSTRIAL APPLICABILITY

The present invention is useful for resin molded articles having excellent wear resistance.

The invention claimed is:

1. A method for producing an automotive window glazing panel which includes a base made of a thermoplastic resin, a wear-resistant surface layer, and an undercoat layer interposed between the base and the wear-resistant surface layer so as to contact the base and the wear-resistant surface layer, comprising the steps of:
   forming the undercoat layer over the base as an adhesive layer having a thickness of 7.5 μm or greater and 14.5 μm or less over the surface of the base, and
   forming the wear-resistant surface layer over the undercoat layer as a plasma-enhanced CVD coating to a thickness of 0.04 μm or greater and 0.40 μm or less to reduce a Taber wear testing haze value of the glazing panel to between 2% and 0.70%, and a density of greater than 1.5 g/cm³ or a hardness of 1.5 GPa or greater with a composition consisting of silicon, oxygen, hydrogen and carbon,
   wherein a composition ratio of the oxygen to the silicon in the wear-resistant surface layer is greater than or equal to 1.54 and less than 1.91, and a composition ratio of the carbon to the silicon is greater than or equal to 0.003 and less than 0.14.

2. An automotive window glazing panel comprising:
   a base made of a thermoplastic resin; and
   an undercoat layer and a wear-resistant surface layer provided on the base in this order,
   wherein a thickness of the undercoat layer is greater than or equal to 7.5 μm and less than or equal to 14.5 μm,
   a hardness of the undercoat layer is lower than that of the wear-resistant surface layer,
   the hardness of the undercoat layer is greater than or equal to 100 MPa and less than or equal to 1.5 GPa,
   the undercoat layer has a first undercoat layer made of a liquid acrylic resin material applied over the base and a second undercoat layer made of a liquid silicone resin material applied over the first undercoat layer,
   the wear-resistant surface layer consists of silicon, oxygen, carbon, and hydrogen,
   a composition ratio of the oxygen to the silicon in the surface layer is greater than or equal to 1.7 and less than 1.91, and a composition ratio of the carbon to the silicon is greater than or equal to 0.003 and less than 0.14,
   a thickness of the wear-resistant surface layer is greater than or equal to 0.04 μm and less than or equal to 0.40 μm,
   a density of the wear-resistant surface layer is greater than 1.5 g/cm³, and
   a hardness of the wear-resistant surface layer is greater than or equal to 1.5 GPa,
   wherein a Taber wear testing haze value of the glazing panel is between about 2% and 0.70%, and
   wherein the wear-resistant surface layer is a plasma-enhanced CVD coating.

* * * * *